United States Patent [19]

Pettit

[11] 4,180,704

[45] Dec. 25, 1979

[54] DETECTION CIRCUIT FOR A BI-DIRECTIONAL, SELF-IMAGING GRATING DETECTOR

[75] Inventor: John W. Pettit, Lexington, Ky.

[73] Assignee: International Business Machines Corporation, Armonk, N.Y.

[21] Appl. No.: 920,306

[22] Filed: Jun. 28, 1978

[51] Int. Cl.² .............................................. H01J 3/14
[52] U.S. Cl. ................................. 250/237 G; 356/395
[58] Field of Search ............ 250/214, 231 R, 231 SE, 250/237 R, 237 G; 324/17 S; 356/39 S, 396

[56] References Cited

U.S. PATENT DOCUMENTS

| | | |
|---|---|---|
| 3,496,364 | 2/1970 | Foskett et al. |
| 3,524,067 | 8/1970 | West. |
| 3,999,064 | 12/1976 | Kramer ........................... 250/237 G |

FOREIGN PATENT DOCUMENTS 36-11793 of 1961 Japan.

OTHER PUBLICATIONS

"Thresholding Circuit", W. R. Yount, IBM Tech. Bull., vol. 20, No. 8., Jan. 1978, pp. 3199, 3200.

*Primary Examiner*—David C. Nelms
*Attorney, Agent, or Firm*—William J. Dick

[57] ABSTRACT

An optical position sensing apparatus utilizing a grating having two sets of opaque and transparent lines thereon, one of the sets being off-set from the other is associated with a source-detector assembly, the source and detector assembly including pairs of light sources and detection devices with at least one of the devices of one of the pairs being aligned with one set of light interrupting opaque lines and the other device of the pair being aligned with the other set of light interrupting opaque lines so that the image of the area illuminated by the opposing source is projected back upon the area of the grating in front of its respective detector as by an imaging reflect surface, preferably a concave mirror.

Because the signal from the detectors varies in time and magnitude, and there is DC leakage from the detectors, it is necessary to establish a threshold detection voltage to insure a proper signal output wave form for both position and direction of relative motion sensing. This is accomplished by generating first and second voltage references to follow the peak and valley of the signal and generating the threshold level detection voltage which may then be compared to the input signal to create a predetermined wave form having a predetermined frequency relationship to the input signal.

16 Claims, 16 Drawing Figures

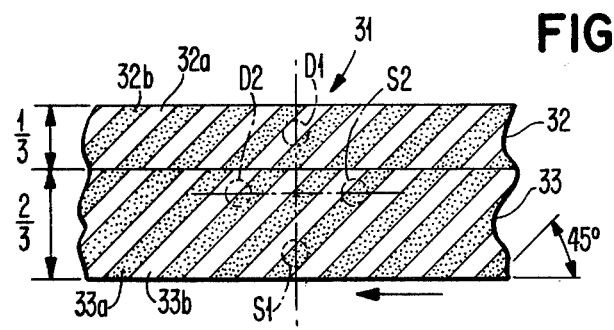
FIG. 3A
FIG. 3B
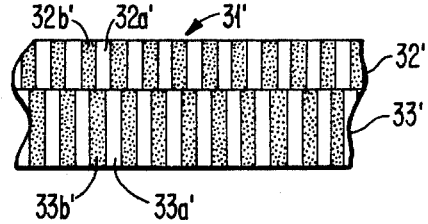
FIG. 4
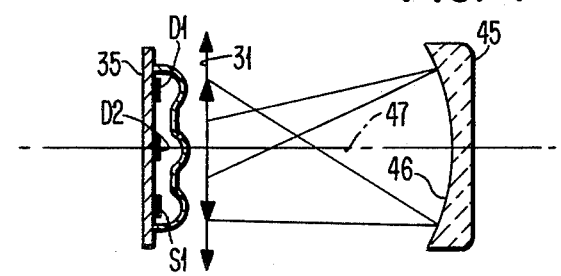
FIG. 5A
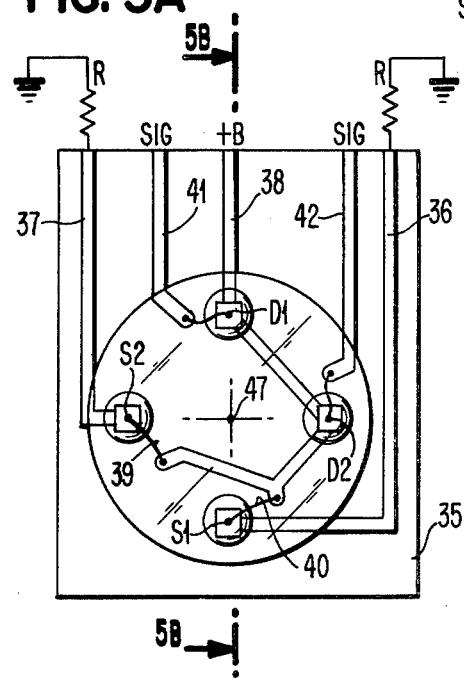
FIG. 5B
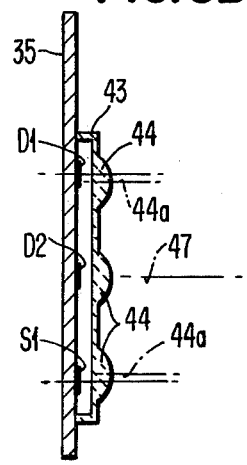

DETECTION CIRCUIT FOR A BI-DIRECTIONAL, SELF-IMAGING GRATING DETECTOR

TECHNICAL FIELD OF THE INVENTION

The present invention relates to optical position sensing apparatus, and more particularly relates to a circuit which enables positive and proper detection of a grating position detection signal which varies in time and magnitude in the presence of D.C. leakage. A threshold level detection voltage is generated as a function of the preceeding signal peak and valley voltage levels, and is compared to the detected signal for outputting a wave form having a predetermined frequency relationship to the signal.

BACKGROUND AND STATE OF THE PRIOR ART

In machinery which is automated, for example, machine tools, printers etc, it is well known to use line grating pairs as position indicating devices. Conventionally, the gratings are moved relative to each other while a light is shone through the gratings which creates an alternate light/dark bar pattern. The bar pattern is sensed by a detector such as a photocell placed on the opposite side of the gratings. Signals generated by the photocell then become a measure of the distance travelled by the grating, and if integrated over time also give a measure of the velocity of the relative motion between the grating pairs.

Such a conventional system has certain disadvantages. For example, it is difficult to position the gratings so that the lines of each grating are aligned properly in parallel relationship, and the grating surfaces themselves must be mounted close enough together to produce a sharp pattern. If there is any misalignment between the two gratings, the light/dark pattern will be fuzzy and the correct output will not be generated by the detector. The result of such misalignment or optical distortion results in missed signals which creates problems with regard to the machinery being controlled by the detector output. The tolerances between two moving line gratings must be held despite changes in atmospheric conditions, the normal wear of moving parts, and the all to real possibility of the gratings moving together and touching one another creating scratches or obliteration of one or more of the lines of the grating. Moreover, the risk of the gratings touching the optical parts creating damage on for example either the detector or the lens further creates a risk of improper generation of the dark and light patterns resulting in malfunctions and creating the possibility of replacing the rather expensive gratings.

In U.S. Pat. No. 3,524,067, issued on Aug. 11, 1970, a compact line grating position sensing device is disclosed, the device comprising a movable line grating with a source of illumination and a detector both mounted on the same side of the grating with means for deflecting and focusing the image of the grating produced by the illumination of the grating back on itself at a point in front of the detector. When the single grating is moved sideways relative to the light source and detector, in a direction perpendicular to the lines of the grating, interference between the grating and the image lines produces alternate illumination and non-illumination of the detector.

Similarly, in Japanese published patent application No. 11793/61, especially FIG. 3 thereof, an optical position sensing scheme is illustrated which includes a grating, and a light source and detector on the same side of the grating. An optical system which includes lenses and a prism reflects and focuses the grating line image produced by the source back upon the grating at a position opposite the detector. As disclosed therein, when the grating is moved relative to the source, the optical system and the detector and the grating line image produced by the source is superimposed on the grating at a position opposite the detector. Accordingly, interference occurs between the grating lines and the image lines to produce alternate illumination and non-illumination images to the detector. In this scheme, the lenses are apparently at a distance of twice the focal length because they are disposed so as to focus the grating line image onto the grating, while the prism is placed behind the lenses at a distance equal to the focal length. In U.S. Pat. No. 3,524,067 and Japanese published patent application 11793/61, the apparatus appears to be only capable of position sensing.

In U.S. Pat. No. 3,496,364 issued on Feb. 17, 1970, is disclosed a linear encoder having a fringe pattern produced by optical imaging. In this system, described in the aforementioned patent, a single ruled scale is illustrated utilizing an optical system which superimposes a rotated image of one portion of the scale upon a second portion of the scale, the image being rotated 180° in the plane of the scale. Movement of the scale in one direction causes the image of the scale to move in the opposite direction. This results in light passing through the second portion of the scale being modulated by the relative movement between the scale rulings and the image of the rulings. By placing two or more photosensitive detectors at the second portion of the scale, the detectors being separated along a length of the scale by a distance suitable to produce out-of-phase electrical signals in response to light passing through the second portion of the scale, the sense of the phase of these signals is a representation of the direction of scale motion while the number of cycles of the signal is representative of the amount of scale motion. In this latter system, the phase information is obtained by generating a moire fringe pattern so that the pattern movement is at a speed or direction or both different than the movement of the encoder scale. This means, however, that some magnification of the image is necessary.

In IBM Technical Disclosure Bulletin, Vol. 20, No. 8, January 1978, pages 3199 and 3200 is disclosed a dynamic thresholding circuit which includes a positive and negative peak follower. The positive peak follower tracks the background level of a video signal while the negative peak follower tracks the maximum video information peaks which may reside in the black information level. A ratio divider of the two variable levels establishes the dynamic threshold level for the other input of a comparator which makes a binary decision as to whether the input signal is video or is background. A noise inhibiting circuit is included with an adjustable variable level output from the positive peak follower so as to provide a level clamp to the ratio divider thus clamping the video levels at a predetermined level below the background noise so as to form or provide a minimum ratio for the input comparator. While this circuit works in the required manner for frequency levels of signals which are relatively high, it will not operate properly at close to DC or DC levels or from a frequency range which is D.C. on up. Moreover, the voltage reference levels i.e., the peak level voltages do not necessarily increase so as embrace the signal swing of one cycle of the signal.

In view of the above, it is a principle object of the pesent invention to provide apparatus which will create a wave form output which is frequency dependent upon the signal input but which is insensitive to the output of a grating detector wherein the signal from the detector is varying in time and magnitude and in the presence of DC leakage.

Yet another object of the present invention is to provide a circuit for grating detector output signal detection which is relatively insensitive to "fuzz" on the signal input wave form so as to inhibit false detection and following of the voltage reference levels for both peaks and valleys thereof.

Yet another object of the present invention is to accomplish the above objects utilizing well known logic block functions which operate digitally so that the implementation cost of the circuitry is minimal in comparison, for example, with hand settable potentiometers and resistors.

Other objects and a more complete understanding of the invention may be had by referring to the following specification and claims taken in conjunction with the accompanying drawings in which:

BRIEF DESCRIPTION OF THE DRAWINGS

FIGS. 3A and 3B are enlarged fragmentary (not to scale) views of a portion of two embodiments of a grating strip which may be employed to generate signals to be processed by the circuit of the present invention while FIG. 3A also shows the relative position of the source-detector assembly as it would appear when looking through the grating strip;

FIG. 4 is a schematic side elevational view of the apparatus illustrated in FIG. 2 showing schematically a simple ray reflection from one light source to one detector;

FIG. 5A is an enlarged side elevational view illustrating a typical source-detector assembly which may be employed;

FIG. 5B is a fragmentary sectional view taken along line 5B–5D of FIG. 5A;

BACKGROUND APPARATUS

Figure 1:
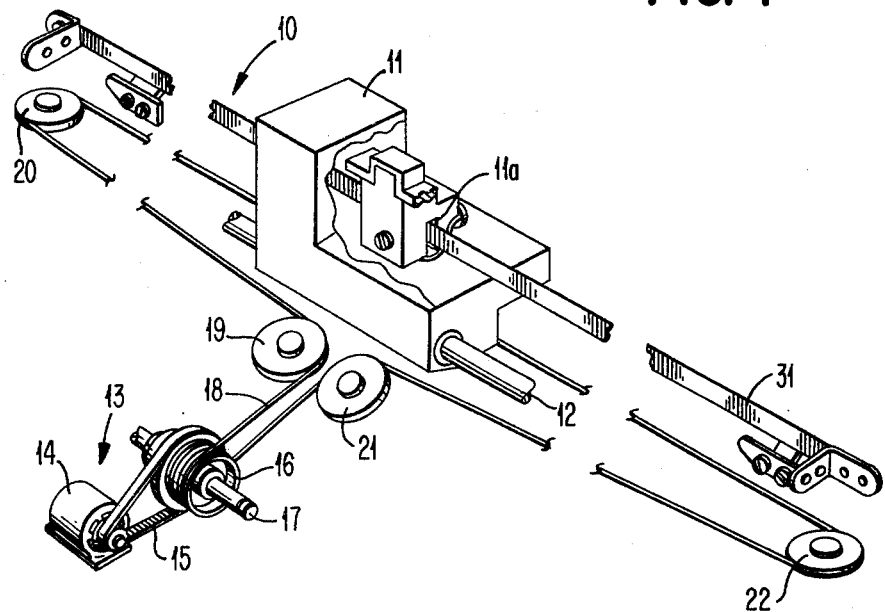
FIG. 1 is a fragmentary perspective view of a portion of a typical machine, in the illustrated instance an ink jet printer, incorporating typical apparatus which may operate with a circuit constructed in accordance with the present invention.

Referring now to the drawings, and especially FIG. 1 thereof, a typical machine 10, in the illustrated instance a portion of an ink jet printer, which may incorporate the novel circuit apparatus of the present invention, is illustrated therein. In the illustrated machine, a carrier 11 is mounted for sliding movement on a shaft 12, the carrier incorporating the standard implements of ink jet printing such as in the IBM 6640 Document Printer. The carrier 11 will typically include a nozzle, charge electrode, deflection plates and gutter (for uncharged drops) for propelling the ink drops against a platen (not shown) for printing on a ink drop receiving medium carried by the platen. The carrier 11 is propelled along the shaft 12 as by drive means 13, including a motor 14 which is coupled through a drive belt 15 to a cable drum 16 which is mounted for rotation on an operational shaft 17. A cable 18 is wound on the drum and passes around pulleys 19 and 20 to the carrier 11, and is connected to the carrier 11 on its opposite side as from pulleys 21 and 22. Accordingly, as the motor 14 rotates, the carrier is propelled in either one of two directions along shaft 12.

Figure 2:
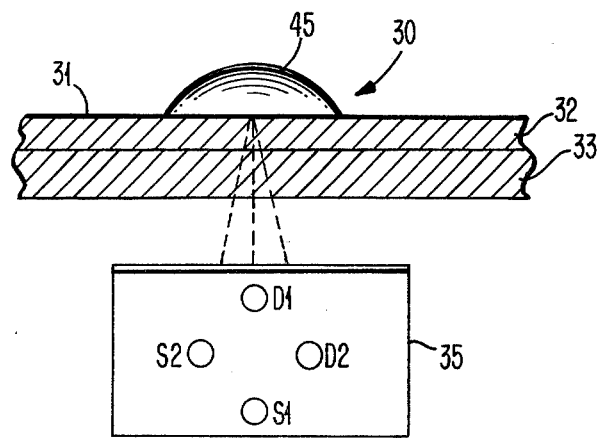
FIG. 2 is a schematic representation of the position of certain portions of the apparatus illustrated in FIG. 1.

It is essential in the printing operation that; (1) The precise position of the carrier (and thus the nozzle associated with the ink jet) be known at any point in the carrier's travel from the lefthand side to the righthand side, and; (2) that the direction of movement of the carrier be known to the electronics associated with the formation of the ink stream which is accomplishing the printing. To this end, an optical position sensing apparatus 30 utilizing a grating 31 having first and second sets 32 and 33 of opaque and transparent lines thereon is adapted for cooperation with a source-detector assembly 35 on one side of the grating 31 and an imaging reflective element 45 on the opposite side of the grating, the imaging reflective element 45 and the source-detector assembly 35 in association with the grating 31 forming the optical position sensing apparatus constructed in accordance with the present invention. As illustrated best in FIG. 1, the grating 31, which may be composed of a flexible mylar strip having opaque lines thereon formed by a photographic process, is mounted so as to be stationary relative to the moving carrier 11, although the carrier could be stationary with means for driving the grating. The grating 31 passes through a suitable slot 11a in the carrier while the source-detector assembly 35 and the imaging reflective element 45 are mounted on the carrier on opposite sides of the grating (see FIG. 2 for relative position).

The typical gratings which may be employed with the circuit apparatus of the present invention are illustrated in FIGS. 3A and 3B, the grating 31 illustrated in FIG. 3A being employed, for reasons which will become more clear hereinafter, in optical position sensing apparatus in which the imaging reflective surface has a short focal length, and the grating 31' being acceptable in systems employing a longer focal length. As illustrated in FIGS. 3A and 3B, there are two sets 32 and 33, 32' and 33' of opaque and transparent lines 32a, 32b, 33a, 33b associated with grating 31, and 32a' 32b', 33a', and 33b' associated with grating 31'. As illustrated, one of the sets, for example, the sets 32 and 32' are offset from the other set of opaque and transparent lines 33 and 33', while one set is superimposed or above the other one on the grating. The offset is preferably 90°, again for purposes which will become more clear hereinafter.

The relative position of the imaging reflective element 45 and the source-detector assembly 35 to the grating 31 or 31' is illustrated best in FIG. 4. The imaging reflective surface is preferably a spherical segment surface or concave surface 46, the grating 31 or 31' lying in a plane which is perpendicular to the mirror axis 47 and located coincident with the center of the spherical surface so as to give a magnification of 1X. Thus the distance from the reflective spherical segment surface 46 along the axis 47 to the grating 31 must be equal to the radius of curvature of the spherical segment surface.

The source detector assembly 35 is best illustrated in FIGS. 5A and 5B, the assembly including pairs of light source and detection devices, S1, D1 and S2, D2 respectively, the source S1 being located the same distance from the central axis 47 of the imaging reflective surface 46 as detector D1, and the source S2 being located the same distance from the central axis 47 as the detector D2. Thus even though for convenience purposes all of the source and detection devices depicted in FIG. 5A are spaced equally from the central axis 47, as long as each device of a pair is located the same distance from the central axis of the imaging reflective surface 46, the apparatus will function correctly. Moreover, as shown schematically in FIG. 3A, at least one of the devices of one of the pairs, in the present instance light detection device D1, must be aligned with one set 32 of light interrupting opaque and transparent lines 32a, 32b while the other device of the pair, source S1 in the present instance, aligned with the other set 33 of light interrupting opaque and transparent lines 33a, 33b of the grating 31. The other light source and detection device pair may be aligned with either one of the sets of opaque and transparent lines, in the present instance pair S2-D2 is aligned with set 33. In this manner, the image of the area illuminated by the opposing source is projected back upon the area of the grating in front of its respective detector as by the imaging reflective surface 46. Inasmuch as the illuminated areas are of the same phase, in the illustrated instance, the projected images will also be of a similar phase. However, the grating lines in front of the detectors, are 90° offset due to the offset of the grating lines. This causes the output signal from the detectors to have a phase relation which will permit direction sensing as to the movement of the carrier 11 in the ink jet printer.

As illustrated best in FIGS. 5A and 5B, the source-detector assembly 35 is preferably mounted in a circuit board like arrangement for ease of connection to wiring within the carrier, although the elements and devices as well as the connections may be by any convenient means keeping with the rules of location relative to the center line 47 as heretofore set forth. As shown best in FIG. 5, the circuit board may have substrate lands 36 and 37 connecting the sources S1 and S2 to ground, as through current limiting resistors R. Alternately, the detector chips (photo transistors) D1 and D2 substrates are connected via a conductor 38 to a B+ supply, the positive supply also being connected as by wire bonds 39 and 40 to the sources S1 and S2, in the illustrated instance light emitting diodes. As is conventional, the light sensing devices D1 and D2 have their outputs taken as at 41 and 42.

Preferably a lens 43 is attached to the substrate, the lens being composed of, for example, a methyl merthacrylate which serves as both a cover and a lens portion 44 over each of the devices so as to aid in focusing both the light emanating from the sources S1 and S2 and the light received from the imaging and reflective surface 46 and passing through the grating. As may be seen best in FIG. 5B, the center lines 44a associated with each of the lens portions 44 is offset slightly from the central axis of each of the devices and towards the central axis 47 of the spherical segment surface 46 so as to obtain maximum utilization of the light both emitted and received without aberration.

With short focal length spherical segment surfaces or concave mirrors, it is desirable that the grating 31 of FIG. 3A be employed wherein the opaque and transparent lines are set at an angle of 45° to reduce the effect of astigmatic aberration on the system. The basic causes of such aberration is described at length in the article "Astigmatism and Spherical Mirror" which appears in the September 1977 issue of "Electro Optical Systems Design" pages 27 et seq. Thus if image quality is important, and where the f number (f no=the focal length/the diameter of the mirror) is 2 or below, the grating 31 illustrated in FIG. 3A should be employed. This will insure that the output of the detectors D1 and D2 will have an output peak at the same point along an optical axis.

Accordingly, with longer focal lengths or in situations where astigmatism or astigmatic effects are unimportant, the grating 31' may be employed. In this connection, inasmuch as the magnification of the system is one (i.e., on magnification) and the effect of relative movement between the carrier and grating is one of interference patterns or a shuttering type effect, an opaque line width of 60% and a transparent line width of 40% will obtain a more stable and better shuttering effect, that is a better interference pattern. However, it is not essential that the line width have the ratio set forth, a 50-50 or even lower ratio being adequate for most purposes. Moreover, inasmuch as only one device of one pair need be aligned with one set of opaque and transparent lines, the sets need not be of uniform height. For example, the set 32 or 32' need be only one third of the width of the grating while the set 33 or 33' would comprise the remaining two thirds.

CIRCUIT OF THE INVENTION

If the gratings are course gratings, the output from the detectors D1 and D2 or phototransistors may be suitably amplified, clipped and then detected for both position sensing and for direction of relative motion between the carrier and the grating. However, in a system, such as an ink jet printer, it is imperative that the grating be of a fine quality (for example 240 lines per inch) and that detection be accurate for both position purposes as well as direction of motion purposes. However, this presents a problem due to the inability to achieve precise detection of a time and amplitude varying signal by utilizing a preset detection threshold voltage.

In accordance with the present invention, the circuit digitally sets the threshold level detection voltage of a detector signal which is varying in time and magnitude and in the presence of DC leakage, compares the threshold level detection voltage with the detector signal and creates a clean wave form signal output, such as a square wave, having a predetermined relation to the frequency of the signal input.

Figure 6:
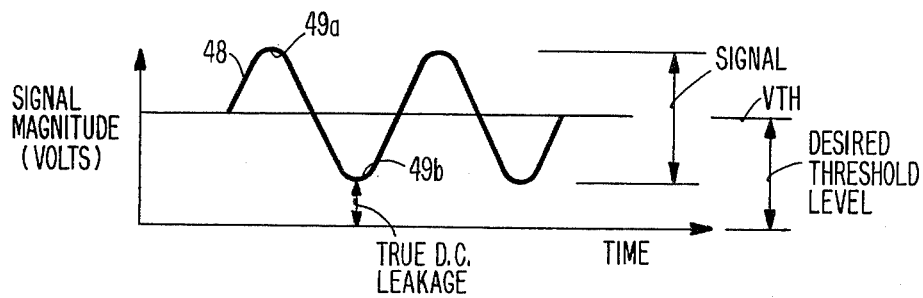
FIG. 6 is a detector output waveform from one of the detectors of the source-detector assembly.
Figure 7:
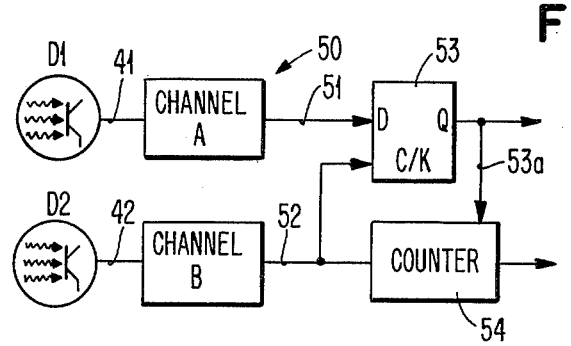
FIG. 7 is a schematic block diagram of apparatus which may be connected to the detector pairs to provide an output which is indicative of both the position and the direction of motion of the apparatus illustrated in FIG. 1 and which incorporates the circuit apparatus of the present invention.

To this end, and referring first to FIG. 6, a typical detector signal output is illustrated in FIG. 6. The wave form of the signal out from either of the detectors D1 or D2 is basically a triangular wave form 48 with rounded peaks 49a and valleys 49b. Because the shuttering effect of the image reflected back upon the grating is imperfect, the wave form will vary in amplitude while the valleys will be above the zero volts DC signal amplitude line by an amount equal to the DC leakage. The desired threshold level detection voltage VTH is adjusted in proportion to the preceeding maximum and minimum, i.e. peak 49a and valley 49b of the grating signal 48. It should be recognized, of course, that because of DC leakage, imperfections in line widths as well as spacing widths, dust, scratches, etc. which may occur on the grating strip, or even the source-detector assembly itself, the threshold level detection voltage VTH will vary because of the DC leakage, and because of signal variations. As will be shown hereinafter, the threshold level detection voltage VTH tracks the leakage and the signal variations so that detection occurs at the proper level, this capability being important when detecting quadrature grating signals so that phasing information is preserved. The overall electrical system 50 is illustrated in FIG. 7, the output of the detectors D1 and D2 preceeding directly into channel A and channel B circuits to provide an output as at 51 or 52 such as shown in the predetermined signals or wave forms 51a and 52a respectively shown in FIG. 14. It should be noted that the square wave output should have a predetermined relation to the frequency of the signal input, in the present instance the same frequency. A delay type flip flop 53 having a clock input (C/K) which is taken from the output of channel B, has a second input D which is taken from the channel A output, and an output Q which will indicate whether the carrier, in the present instance the carrier 11 of the ink jet printer, is moving from left to right such as illustrated by the arrow 51b in FIG. 14 or the carrier is moving from right to left, for example on the return cycle of the carrier and moving in the direction of the arrow 51c. For example, if the direction of the carrier is in the direction noted by arrow 51b, if the square wave 51a is high upon the receipt into the flip flop of the leading edge of the wave form 52a (from channel B), the output from the Q output of the flip flop 53 may be a digital 1. Alternatively, if the output wave form 51a is low on the leading edge of the output wave form 52a, then the output taken from output Q from flip flop 53 is a logical zero indicating the motion of the carrier is in the direction of the arrow 51c. Additionally, the output from channel B, i.e. wave form 52a may be applied to a counter 54 which also receives an input from the Q output of flip flop 53, as along line 53a to indicate to the counter as to whether to count up or count down, and the counter output then will give a representation (digitally) as to the exact position the carrier is in at any one time during its motion from the left to the right, or from the right to the left.

Figure 8:
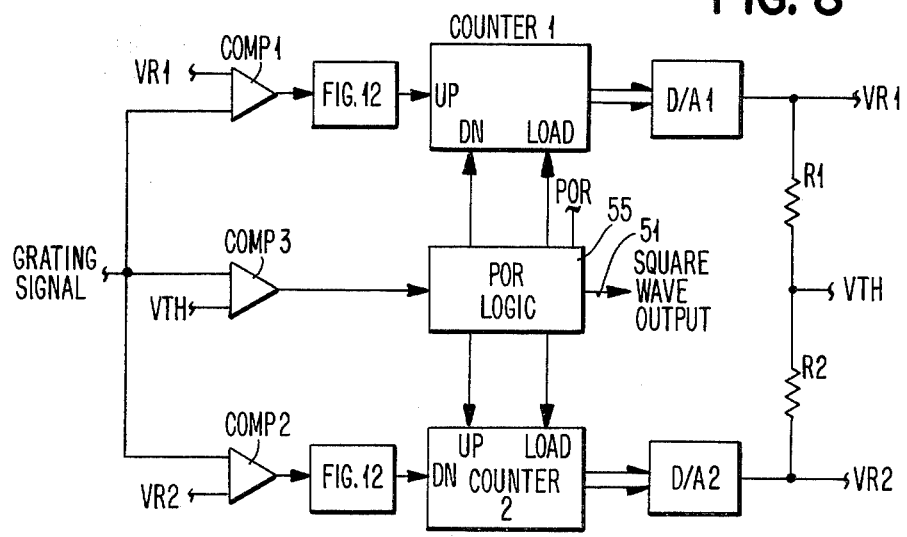
FIG. 8 is a schematic diagram of the circuitry of one of the channels illustrated in FIG. 7.
Figure 9:
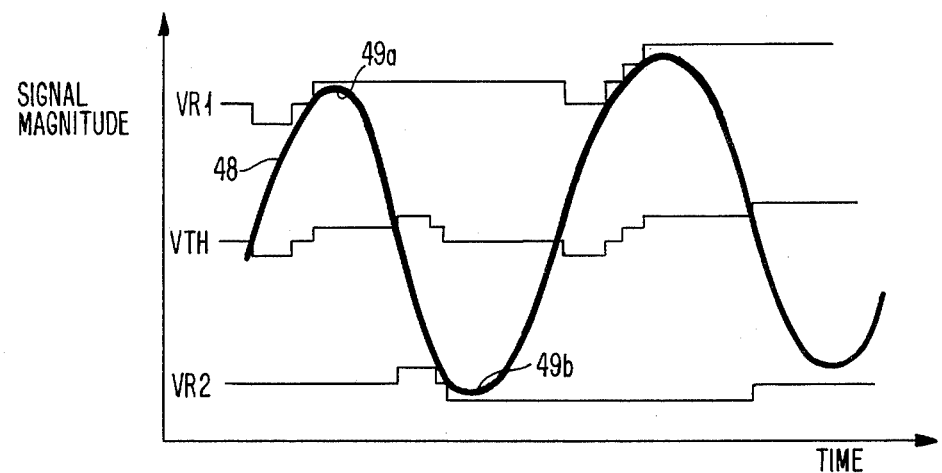
FIG. 9 is a waveform diagram similar to that shown in FIG. 6 but illustrating how the threshold level is obtained for proper operation of the circuitry of FIGS. 7 and 8.

Inasmuch as the circuitry of channels A and channel B is identical, the circuitry of a single channel, such as the channel A will be discussed relative to FIGS. 8–13. The novel detection circuit, hereinafter described relative to those aforementioned figures overcomes the low frequency detection problems associated with various AC detection methods illustrated in the prior art. The circuitry hereinafter discussed can operate at DC and at the flow frequencies encountered in start up of the carrier relative to the grating. Referring now to FIGS. 8 and 9, the circuit generates voltage references VR1 and VR2 respectively which follow the grating signal peaks 49a and valleys 49b in quantisized steps. In essence, the grating signal such as a signal 48 illustrated graphically in FIG. 6, is taken from substrate land 41 illustrated in FIG. 5A, and applied as an input to three comparators designated COMP 1, COMP 2 and COMP 3 respectively. The signal from the comparators COMP 1 and COMP 2 may be applied to a de-sensitizer circuit (which is the preferable form of the circuit) illustrated in FIG. 12, and which will be discussed in more detail hereinafter. The signal, however, is applied to an up/down counter designated counter 1, and then to a digital-to-analog convertor D/A 1 to provide the voltage reference output VR1. In a like manner, the output from comparator 2 is applied through a portion of the de-sensitizer circuit illustrated in FIG. 12 and then to a counter designated counter 2 and then to a digital-to-analog convertor D/A 2 to provide a voltage referenced output VR2. Essentially, comparators 1 and 3, counter 1, and D/A 1 provides a sample and hold function for the grating signal peaks such as the peak 49a in wave form 48 illustrated in FIG. 6. Likewise, comparators 2 and 3, counter 2, and D/A 2 provides a sample and hold function for the signal valleys 49b. Resistors R1 and R2 are employed to produce the voltage threshold level detection voltage, VTH. As will become more evident hereinafter, the threshold level detection voltage VTH may be calculated from the equation: VTM=VR1 (R2)+VR2 (R1)/R1+R2. The ratio of R1:R2 may be chosen depending upon the wave form shape of the grating signal to yield the desired output duty cycle. For example, a 50% duty cycle for a triangular grating signal would require R1 to equal R2.

Assuming that the carrier 11 is moving from the left to the right with respect to a fixed grating 31, when the grating signal (with a positive slope) crosses the threshold level detection voltage VTH, which has been fed back into comparator 3, while VR1 and VR2 have been respectively fed back into COMPS 1 and 2, comparator 3 toggles or changes state causing counter 1 to decrement one step so that VR1 will be reduced below the next upcoming peak value, for example the peak 49a of the wave form 48 (see FIG. 9). As the grating signal increases, the signal crosses the now reduced voltage reference level VR1 which causes comparator 1 to toggle, which increments counter 1 one step. This effects an increase in voltage reference level VR1. (Logic speeds of course, must be faster than changes in the analog grating signal, which is a practical limitation on grating signal frequency). In this manner, the grating signal repeatedly increments voltage reference 1 until voltage reference VR1 exceeds and captures the new signal peak 49a. In a similar manner, when the grating signal crosses the threshold level detection voltage VTH with a negative slope, comparator 2 toggles causing counter 2 to increment one step (i.e. go towards VTH) so that voltage reference VR2 will be increased above the next signal valley 49b. As the grating signal continues to decrease (go negative with respect to VTH), it crosses the new voltage reference VR2 value causing comparator 2 to change its state which decrements counter 2 one step. This results in voltage reference VR2 decreasing a predetermined amount which again makes voltage reference VR2 greater than the signal magnitude. As with voltage reference VR1, voltage reference VR2 is repeatedly decremented until it is reduced below the new signal valley 49b. In this manner, the value of the threshold level detection voltage VTH at the point of threshold detection is thus proportional to the preceeding signal peak and valley values because the generated voltage reference levels have embraced the signal swing of one complete cycle of the signal. In this connection, it will be noted that voltage reference VR1 and VR2 may converge on a decreasing magnitude alternating signal one step per cycle but can expand on an increasing alternating signal multiple steps per cycle.

Figure 14:
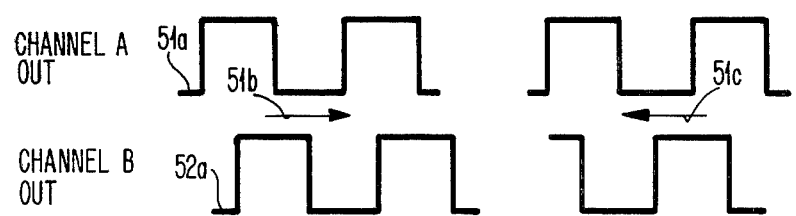
FIG. 14 is the output waveform diagram illustrating the outputs associated with the circuitry described in FIGS. 7 through 13.

In order to insure that the circuitry will adjust to the signal present, and inhibit the square wave output such as the output illustrated in FIG. 14, until proper adjustment is achieved, for example at start up, power on reset (POR) logic circuitry presets counters 1 and 2 at the power on reset time. Thus the purpose of the POR logic circuitry 55 illustrated in FIG. 8 is required to insure that voltage references VR1 and VR2 will adjust to capture respectively the signal peak 49a and valley 49b. In this connection, it should be noted that if the initial values for voltage references VR1 and VR2 were chosen such that the threshold level detection voltage VTH was not within the peak to peak bounds or limits of the signal, there could be no output signal or adjustment of the two references.

Figure 10:
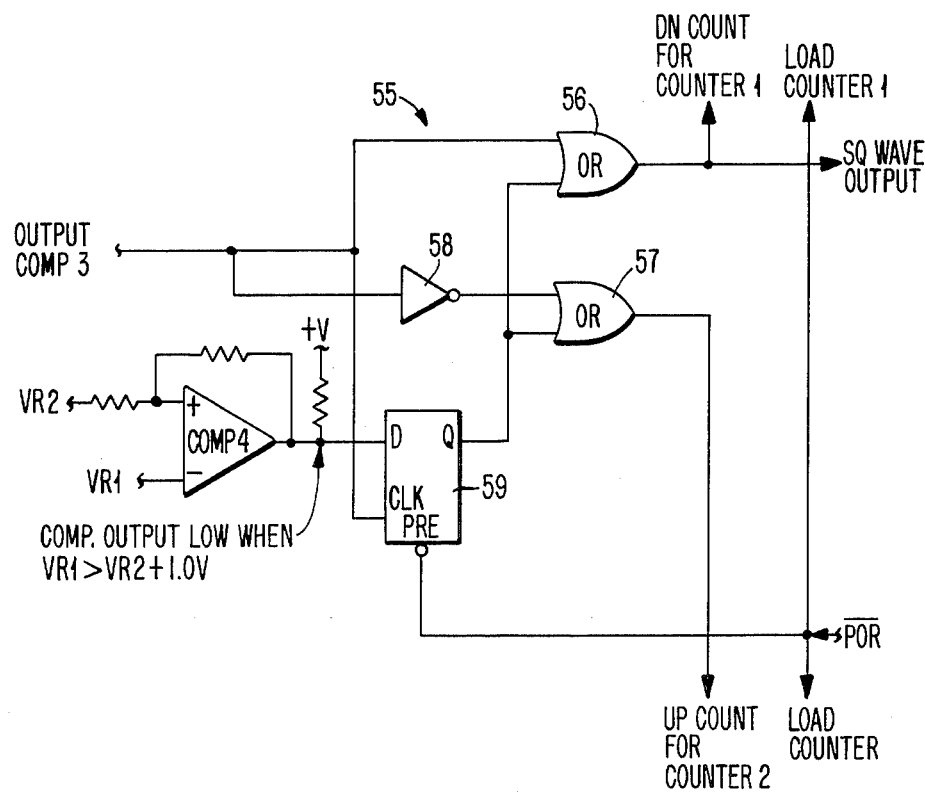
FIG. 10 is a further schematic diagram illustrating the circuitry of the POR logic box illustrated schematically in FIG. 8.
Figure 11:
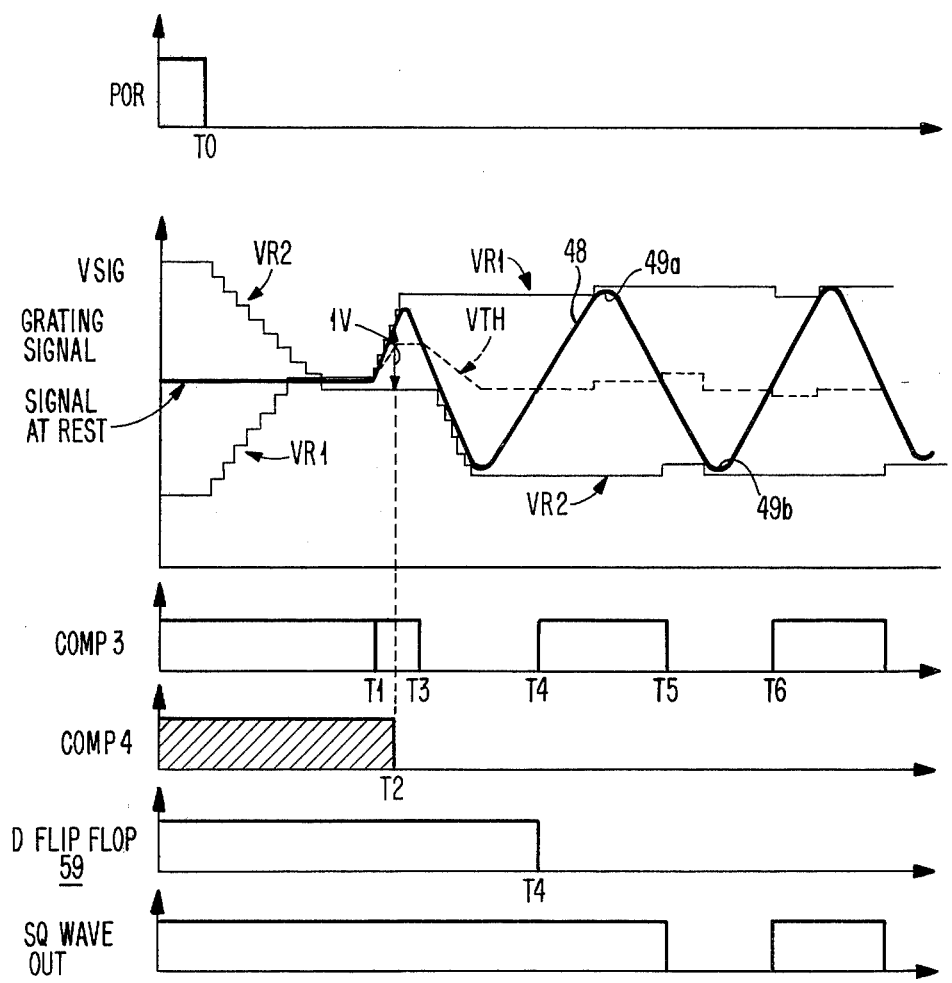
FIG. 11 is a waveform diagram illustrating the various waveforms at certain times in a cycle and associated specifically with FIGS. 8 and 10.
Figure 12:
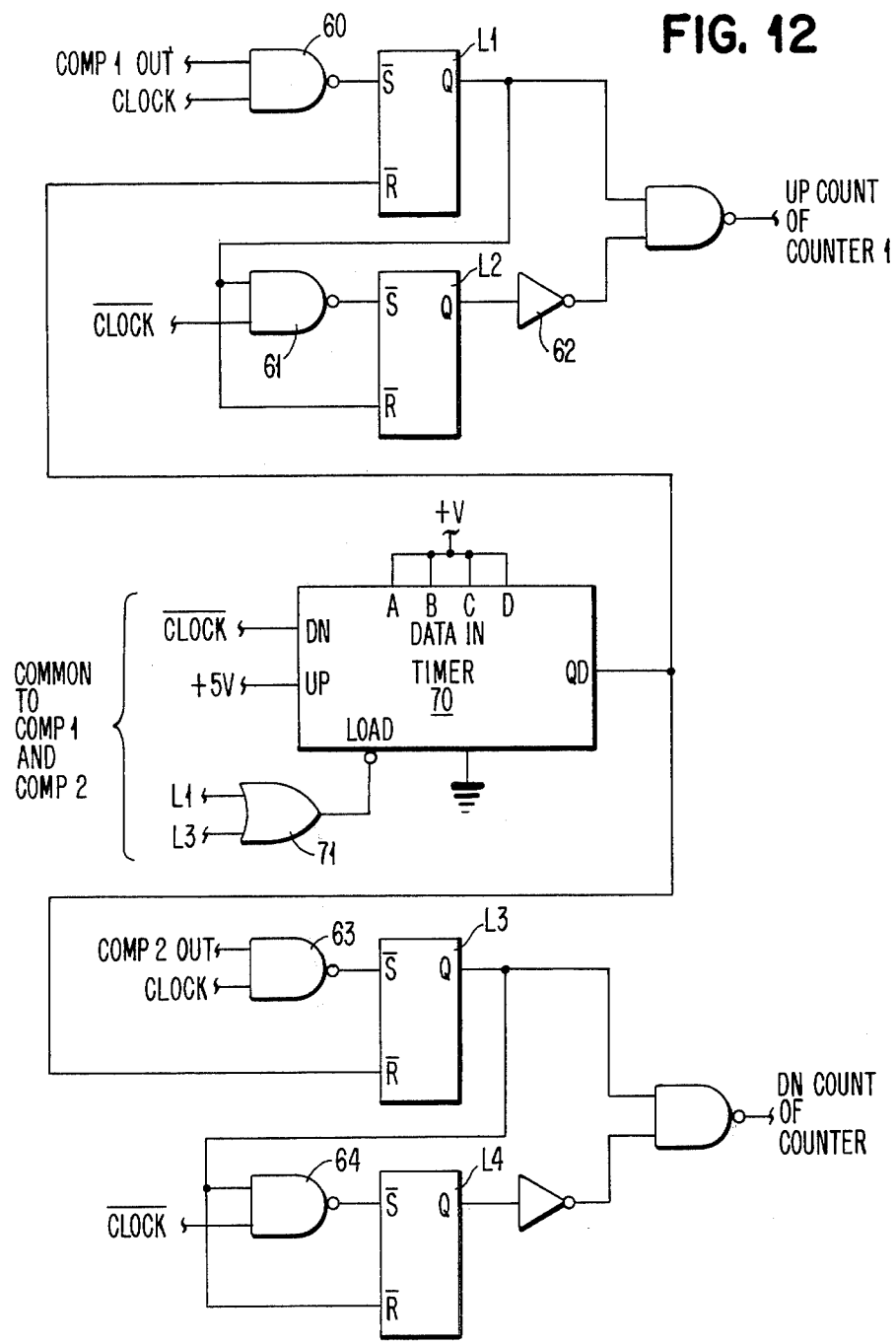
FIG. 12 is a schematic diagram of a de-sensitizing circuit incorporated into the diagram of FIG. 8.

Turning now to FIGS. 10 and 11, the POR logic circuitry 55 is illustrated therein, while in FIG. 11 is shown a signal timing diagram which will aid in explaining the operation of the POR logic circuitry in conjunction with the other circuitry of one channel illustrated in FIG. 8. As is well known, when electronic apparatus is powered up, initialization of the logic circuits within the apparatus must occur before the machine is ready for operation. Conventionally, the initialization signal is referred to as a power on reset or POR signal. Accordingly, assuming that power has just been turned on, the power on reset signal POR will be high as shown in the timing chart of FIG. 11. As illustrated in FIG. 10, the POR logic circuitry receives inputs from comparator 3 (see FIG. 8), voltage reference VR2 and voltage reference VR1. The output from comparator 3 is applied to a first OR gate 56, and the inverted output from comparator 3 is applied to a second OR gate 57, the signal being inverted as by an invertor 58. Voltage reference signals VR1 and VR2 are applied to a fourth comparator COMP 4 the output of which is coupled to the delay input D of a delay type flip flop 59. The clocked output Q of the flip flop 59 being applied as a second input to OR gates 56 and 57 respectively. Thus when the power on reset signal is high, the D flip flop 59 is preset high, which forces the square wave output signal to be high through the OR gating. The state of comparator 3 is unknown (and thus the shaded area in the timing chart of FIG. 11) during the time period up to time T1. During the time that the POR signal is high, that is up to time T0 when the machine is initialized, voltage reference VR1 is set to its minimum value while voltage reference VR2 is set to its maximum value (voltage reference VR1 below the minimum signal peak, and voltage reference VR2 above the maximum signal valley as illustrated in the timing chart). Comparator COMP 4's output is high to the D input of the delay type flip flop 59 during power on reset. When the POR signal goes low at time T0, both comparators 1 and 2 are high, so that counters 1 and 2 respectively increment and decrement voltage references VR1 and VR2 as illustrated in the timing chart. Voltage reference VR1 is incremented until it is larger than the signal value, that is immediately above the signal at rest position noted in the timing chart (this occurs because the carrier 11 is not moving with respect to the grating at this time). Upon the voltage reference VR1 incrementing until it is larger than the signal value, comparator 1 (FIG. 8) goes low. In a similar manner, voltage reference VR2 is decremented until it is less than the signal value at which time comparator 2 goes low. Assuming that at time T1 relative motion occurs between the carrier 11 and the grating, and that the signal moves in a positive direction first, causing voltage reference VR1 to track the signal up in discrete steps, at time T2 voltage reference VR1 is greater than voltage reference VR2 by one volt, causing comparator 4 to go low. When the signal crosses the threshold level detection voltage VTH at time T3, the output of comparator 3 goes low, and voltage reference VR2 now tracks the negative slope signal in discrete steps as shown, capturing the signal's valley. At time T4, comparator 3 makes a low to high transistion on the clock input of the D type flip flop 59 because of the transistion of the positive going wave form past the threshold level detection voltage VTH. Since the D input (comparator 4 output) is low on this rising clock edge, the Q output from the flip flop 59 falls low at this time. When this Q output is low, the square wave output tracks the comparator 3 output. Additionally, the down count for counter 1 and the up count for counter 2 becomes operational due to the outputs from OR gates 56 and 57. The square wave output thus makes its first high to low transistion at time T5 inasmuch as counter 2 has its first up count at time T5 and counter 1 has its first down count at time T6. Accordingly, after time T4 it is known that the references have capatured the signal and proper operation from thereon is insured.

The signal enamating from the phototransistors or detectors D1 and D2 is in reality not as clean a signal as is desired for proper operation of the circuit in FIG. 8 when the number of lines per inch of the grating becomes dense. For example, the signal output and that which is applied to comparators 1, 2 and 3 may contain multiple spurious noise like patterns on the wave form of the signal. This noise can create multiple counts being sent from the comparators 1 and 2 to the counters 1 and 2 which cause the digital to analog convertors 1 and 2 to take multiple steps instead of single discrete wave form following steps desired. Accordingly, an automatic desensitizing circuit may be employed intermediate the comparators 1 and 2 and the respective counters to prevent excess counts of the counter and thus the digital to analog convertors. To this end, and referring now to FIG. 12, the circuit illustrated therein masks out bounces or spurious signals for a specified time period after the initial comparator transistion. For example, and referring now to FIGS. 12 snd 13, a clock may be provided, the clock having an output which is a multiple of the input signal of the grating to the system. In the instance shown, latch L1 will be set upon the coincidence of comparator 1 and the clock output both being high as applied to NAND gate 60 (the output therefore will be low and the set condition for the latch L1 will be S). As illustrated, the timer or a timer-counter 70 is loaded as through OR gate 71 at the same time the latch L1 is set. Latch L2 is then set on the coincidence of the output of latch L1 and a CLK through NAND gate 61. The output of latch L1 is nanded with L2 as through inverter 62 to apply a low pulse or down signal to counter 1. As shown, latches L1 and L2 are reset by the timer-counter 70 output QD going low. The process repeats itself as soon as the comparator output goes high after the time out period of n clock pulses is completed. In a situation where the comparator remained high past the time out period (or validly went high before the time out was completed), a pulse will be generated every n clock pulses as the cycle repeats itself. In this implementation, the timer counter 70 is preloaded to a count, for example, of 15 and counted down to 7 (where n equals 8), at which time the QD output from the timer counter 70 goes low resetting latches L1 and L2.

The automatic desensitizing circuit works in an identical manner for comparator 2's output which is applied upon coincidence of the clock and comparator 3 output through NAND gate 63 to latch L3 thereby through OR gate 71 setting the timer. Latch L4 is then set by the coincidence of the output from latch L3 and clock through NAND gate 64. The Q output of latches L3 and L4 are nanded as before to give a pulse to the down counter of counter 2, the latches being reset by the output QD of timer counter 70 just as with the comparator 1 input.

Figure 13:
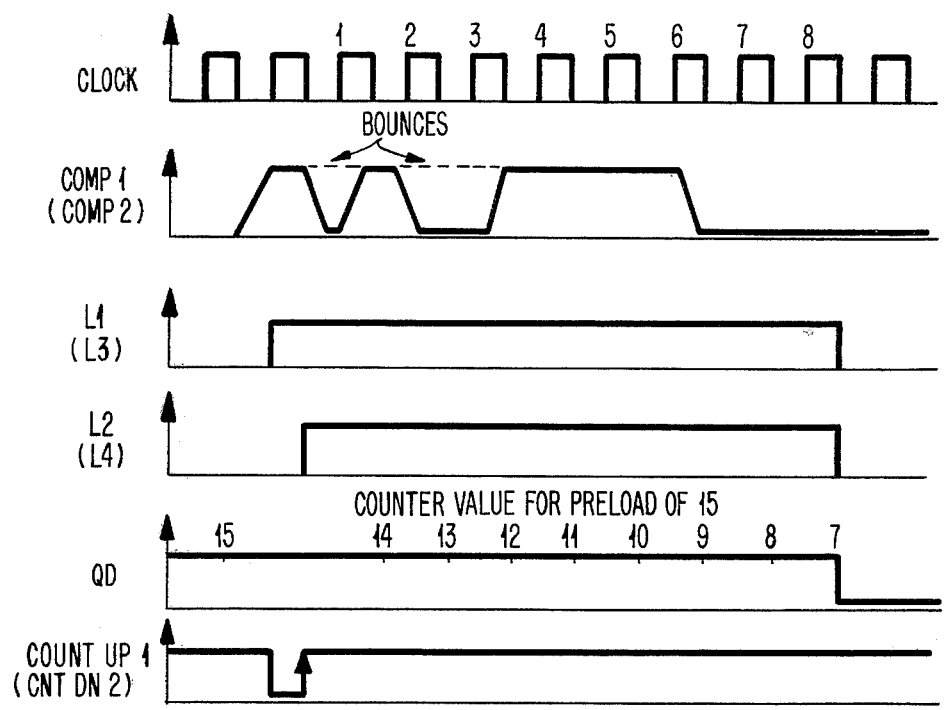
FIG. 13 is a timing chart related to the circuit of FIG. 12.

FIG. 13 shows a typical timing chart for the comparators and latch conditions, the outputs from L1 and L3 being identical as well as the outputs from L2 and L4 being identical. For example purposes, the counter value as described above has been preset at a preload of 15 to allow a transistion at count 7 (n equals 8).

Thus the detection circuit of the present invention will provide both position and direction of motion signals, even when operating upon a signal which is varying in time and magnitude and in the presence of DC leakage. This is accomplished by comparing a derived threshold detection level voltage with the signal input to generate a predetermined signal, in the illustrated instance a square wave, having a frequency relationship to the frequency of the input signal.

Although the invention has been described with a certain degree of particularity, it is understood that the present disclosure has been made only by way of example and that numerous changes in the details of construction and the combination and arrangement of parts may be made without departing from the spirit and scope of the invention as hereinafter claimed:

What is claimed is:
1. Apparatus for setting the threshold level detection voltage of a signal which is varying in time and magnitude and in the presence of D.C. leakage; said apparatus comprising:
   means for generating a first voltage reference level for following the peak of the signal wave form;
   second means for generating a second voltage reference level for following the valley of the signal wave form;
   means for comparing said first and second voltage reference levels with said signal for altering said reference levels until said first and second voltage levels embrace the signal swing of one complete cycle of said signal;
   means for continuously deriving from said voltage references a threshold level detection voltage which varies with said first and second voltage references; and
   means for continuously comparing said threshold level detection voltage which said signal wave form to create a predetermined signal output therefrom, having a predetermined relation to the frequency of the signal input.

2. Apparatus for setting the threshold level detection voltage in accordance with claim 1, wherein said means for generating a first voltage reference level comprises a first comparator, a first counter having its up input connected to said first comparator's output and its output connected to the input of a first digital to analog convertor, the output of said first digital to analog convertor providing a first input to said first comparator and said signal providing the second input to said first comparator.

3. Apparatus for setting the threshold level detection voltage in accordance with claim 2, wherein said second means for generating a second voltage reference level comprises a second comparator, a second counter having its down input connected to said second comparator's output, and its output connected to the input of a second digital to analog convertor, the output of said second digital analog convertor providing a first input to said second comparator and said signal providing the second input to said second comparator.

4. Apparatus for setting the threshold level detection voltage in accordance with claim 3 wherein said means for continuously deriving from said voltage references a threshold level detection voltage comprises a resistive divider network intermediate the outputs of said first and second digital to analog convertors.

5. Apparatus for setting the threshold level detection voltage in accordance with claim 3 wherein said means for continuously comparing said threshold level detection voltage with said signal wave form comprises a third comparator having first and second inputs, said first input being a signal input and said second input being a threshold level detection voltage input.

6. Apparatus for setting the threshold level detection voltage in accordance with claim 5 including logic circuit means connected to the output of said third comparators, said logic circuit means including means connected to said first counter for decrementing said first counter upon coincidence of the threshold level detection voltage and a rising voltage signal waveform, and means connected to said second counter for incrementing said second counter upon coincidence of the threshold level detection voltage and a descending voltage signal wave form.

7. Apparatus for setting the threshold level detection voltage in accordance with claim 6 wherein, upon said first voltage reference level coinciding with a rising voltage signal wave form, said first counter increments, and upon said second voltage reference level coinciding with a descending voltage signal wave form, said second counter decrements.

8. Apparatus for setting the threshold level detection voltage in accordance with claim 7 including desensitizing circuit means intermediate said first counter and said first comparator and said second counter and second comparator for limiting respectively the number of increments and decrements of said counters.

9. Apparatus for setting the threshold level detection voltage in accordance with claim 1 wherein said apparatus of claim 1 forms a first channel, a second channel including all of the means of claim 1 forming said second channel, said second channel being responsive to a second signal in the same manner as said means forming said first channel, said second signal bearing a phase relationship with respect to said first signal, and means responsive to signal outputs of each of said channels for indicating the phase relation of said signal outputs.

10. In a bi-directional, self-imaging grating detection apparatus comprising:
a grating comprising a strip of transparent material having first and second sets of light interrupting opaque lines thereon, said first set of lines being positioned above said second set of opaque lines and laterally offset therefrom;
a source-detector assembly comprising first and second pairs of light source and detection devices, each of said pairs comprising a light source means and a light detection means, and positioned on one side of said grating;
at least one of said devices of one of said pairs being aligned with said first set of light interrupting opaque lines and the other of said devices of said pair being aligned with the other set of light interrupting opaque lines;
an imaging reflective surface on the opposite side of said strip having a central axis which passes through a point mid way between the light source means and light detection means of each of said pairs or light source and detection devices;
means for effecting relative movement between said grating and said source-detector assembly whereby the images detected in the moving system by the detectors are offset to thereby effect a signal output by said detectors of a different phase relation;
an improved signal detection circuit comprising: first and second channels each having its input connected to a light detection means output and for providing a predetermined signal output having a predetermined relation to the signal input from said detectors, each of said channels comprising:
means for generating a first voltage reference level for following the peak of the signal waveform;
second means for generating a second voltage reference level for following the valley of the signal waveform;
means for comparing said first and second voltage reference levels with said signal for altering said reference levels until said first and second voltage levels embrace the signal swing of one complete cycle of said signal;
means for continuously deriving from said voltage references a threshold level detection voltage which varies with said first and second voltage references; and
means for continuously comparing said threshold level detection voltage with said signal waveform to create said predetermined signal output therefrom.

11. In a bi-directional, self-imaging grating detection apparatus in accordance with claim 10, including means responsive to signal outputs of each of said channels for indicating the phase relation of said signal outputs.

12. In a bi-directional, self-imaging grating detection apparatus in accordance with claim 10 wherein:
said means for generating a first voltage reference level comprises a first comparator, a first counter having its up input connected to said first comparator's output and its output connected to the input of a first digital to analog convertor, the output of said first digital to analog convertor providing a first input to said first comparator and said signal providing the second input to said first comparator; and
wherein said second means for generating a second voltage reference level comprises a second comparator, a second counter having its down input connected to said second comparator's output, and its output connected to the input of a second digital to analog convertor, the output of said second ligital analog convertor providing a first input to said second comparator and said signal providing the second input to said second comparator.

13. In a bi-directional, self-imaging grating detection apparatus in accordance with claim 12 wherein said means for continuously comparing said threshold level detection voltage with said signal waveform comprises a third comparator having first and second inputs, said first input being a signal input and said second input being a threshold level detection voltage input;
logic circuit means connected to the output of said third comparator, said logic circuit means including means connected to said first counter for decrementing said first counter upon coincidence of the threshold level detection voltage and a rising voltage signal waveform, and means connected to said second counter for incrementing said second counter upon coincidence of the threshold level detection voltage and a descending voltage signal waveform.

14. In a bi-directional, self-imaging grating detection apparatus in accordance with claim 13 wherein, upon said first voltage reference level coinciding with rising voltage signal waveform, said first counter increments and upon said second voltage reference level coinciding with a descending voltage signal waveform, said second counter decrements.

15. In a bi-directional, self-imaging grating detection apparatus in accordance with claim 14 including desensitizing circuit means intermediate said first counter and said first comparator and said second counter and second comparator for limiting respectively the number of increments and decrements of said counters.

16. In a bi-directional, self-imaging grating detection apparatus in accordance with claim 15 wherein said means for continuously deriving from said voltage references a threshold level detection voltage comprises a resistive divider network intermediate the outputs of said first and second digital to analog convertors.

* * * * *